United States Patent
Tubul et al.

(10) Patent No.: US 9,442,151 B2
(45) Date of Patent: Sep. 13, 2016

(54) METHODS, SYSTEMS, AND COMPUTER READABLE MEDIA FOR DETECTING ELECTRICAL DISCONNECTION BETWEEN INTEGRATED CIRCUIT CHIP ELECTRICAL CONNECTIONS AND CORRESPONDING ELECTRICAL CONTACTS ON A PRINTED CIRCUIT BOARD OR CHIP SOCKET DURING TESTING OF THE CHIP UNDER ENVIRONMENTAL CONDITIONS

(71) Applicant: SanDisk Technologies Inc., Plano, TX (US)

(72) Inventors: Shai Tubul, Omer (IL); Evgeni Bassin, Beer Sheva (IL); Victor Romanov, Petach Tikva (IL)

(73) Assignee: SanDisk Technologies LLC, Plano, TX (US)

( * ) Notice: Subject to any disclaimer, the term of this patent is extended or adjusted under 35 U.S.C. 154(b) by 281 days.

(21) Appl. No.: 14/299,665

(22) Filed: Jun. 9, 2014

(65) Prior Publication Data

US 2015/0355261 A1    Dec. 10, 2015

(51) Int. Cl.
*G01R 31/04* (2006.01)
*G01R 31/28* (2006.01)

(52) U.S. Cl.
CPC .............. *G01R 31/046* (2013.01); *G01R 31/04* (2013.01); *G01R 31/2801* (2013.01); *G01R 31/2884* (2013.01); *G01R 31/041* (2013.01);
(Continued)

(58) Field of Classification Search
CPC .. G01R 31/04; G01R 31/041; G01R 31/043; G01R 31/045; G01R 31/046; G01R 31/2801; G01R 31/2805; G01R 31/2806; G01R 31/2808; G01R 31/2831; G01R 31/2884; G01R 31/3004; G01R 31/3008; G01R 31/318511; G01R 31/31924; G01R 1/04
USPC .............. 324/538, 537, 500, 762.01, 762.02, 324/762.03, 763.01, 763.02, 555
See application file for complete search history.

(56) References Cited

U.S. PATENT DOCUMENTS

| | | | | |
|---|---|---|---|---|
| 4,632,485 A | * | 12/1986 | Brown ............... | G01R 1/07314 29/842 |
| 5,248,075 A | * | 9/1993 | Young ................. | H05K 7/1061 156/378 |
| 6,002,264 A | * | 12/1999 | Gilbert .............. | G01R 31/2887 324/750.25 |

(Continued)

OTHER PUBLICATIONS

"Understanding the Flash Translation Layer (FTL) Specification," AP-684, Application Note, Intel, pp. 1-20 (Dec. 1998).

*Primary Examiner* — Hoai-An D Nguyen
(74) *Attorney, Agent, or Firm* — Jenkins, Wilson, Taylor & Hunt, P.A.

(57) ABSTRACT

A method for detecting electrical disconnections of a chip during testing under environmental conditions includes providing n monitor connections on a chip from which a voltage or current can be sensed during testing of the chip under environmental conditions, where n is an integer of at least one. M sensing connections are provided on the chip, where m>n. An electrical circuit for electrically connects the n monitor connections with the m sensing connections. The electrical circuit has a characteristic that changes when one or more of the m sensing connections is disconnected from its corresponding contact on the printed circuit board or chip socket. The electrical circuit is monitored via the n monitor connections during the testing. It is determined based on changes in the characteristic, whether one or more of the m sensing connections is disconnected from the printed circuit board or chip socket.

25 Claims, 9 Drawing Sheets

(52) U.S. Cl.
CPC .......... *G01R31/043* (2013.01); *G01R 31/045* (2013.01); *G01R 31/2805* (2013.01)

(56) References Cited

U.S. PATENT DOCUMENTS

| | | | | |
|---|---|---|---|---|
| 6,590,409 B1* | 7/2003 | Hsiung | ............. | G01R 31/2831 324/501 |
| 2002/0137380 A1* | 9/2002 | Shishikura | ........... | G06K 7/0013 439/188 |
| 2004/0100299 A1* | 5/2004 | Murakawa | ............. | G09G 3/006 324/762.09 |
| 2005/0122127 A1* | 6/2005 | Grillette | ............. | G01R 31/2896 324/750.02 |
| 2007/0063684 A1* | 3/2007 | Adragna | ................. | H02M 1/32 323/284 |
| 2010/0117670 A1* | 5/2010 | Song | .................. | G01R 31/2886 324/756.05 |
| 2012/0139572 A1* | 6/2012 | Kim | ................... | G01R 31/2889 324/754.07 |

* cited by examiner

METHODS, SYSTEMS, AND COMPUTER READABLE MEDIA FOR DETECTING ELECTRICAL DISCONNECTION BETWEEN INTEGRATED CIRCUIT CHIP ELECTRICAL CONNECTIONS AND CORRESPONDING ELECTRICAL CONTACTS ON A PRINTED CIRCUIT BOARD OR CHIP SOCKET DURING TESTING OF THE CHIP UNDER ENVIRONMENTAL CONDITIONS

TECHNICAL FIELD

The subject matter described herein relates to testing integrated circuit chips under environmental conditions. More particularly, the subject matter described herein relates to methods, systems, and computer readable media for detecting electrical disconnection between integrated circuit chip electrical connections and corresponding electrical contacts on a printed circuit board or chip socket during testing of the chip under environmental conditions.

BACKGROUND

Packages of chip devices are built from several layers with different thermo-mechanical characteristics. During production, chip devices must pass different reliability stress tests, including several cycles of heating and cooling profiles. During such testing, chip packaging may suffer from warpage. FIGS. 1A and 1B illustrate two types of package warpage scenarios. FIG. 1A illustrates dome type warpage where contacts 100 in the center of the lower side of an integrated circuit (IC) chip package 102 are disconnected from corresponding electrical contacts on a printed circuit board (PCB) (not shown) when the center of IC chip package 102 extends upwards to form a dome. Such warpage may occur by thermal contraction of IC chip package 102 during environmental testing. In FIG. 1B, camber type warpage occurs where the edges of chip package 102 bend upward disconnecting contacts 100 near the edges from the corresponding contacts on a printed circuit board. The camber type warpage illustrated in FIG. 1B may be caused by thermal expansion of IC chip package 102 during environmental testing. Although FIGS. 1A and 1B illustrate warpage in a single direction, it is understood that IC chips extend laterally in two directions and that warpage can occur in both directions.

Part of the reliability testing of an IC chip includes functional testing under different temperatures and on special boards, referred to as BIBs (Burn-In-Boards), designed for such functional and environmental testing. Burn-in-Boards include chip sockets that hold the device while the device is stressed in an environmental chamber, and, during application of the environmental stress, the device remains powered and performing desired functional activities. Package warpage resulting from heating and cooling cycles may cause to one or several pins to be disconnected from the socket or to create an unstable contact state. This disconnection may change the stress conditions and can cause over or under stress (current spikes for example) and even destroy the device under test (DUT).

The ability to easily monitor proper device-to-socket connection during stress is important to ensure correct stress conditions and to screen out possible setup-related (false) failures in short time.

Two possible methods to solve at least some of problems associated with testing chips under environmental conditions are:

1. Minimize the warpage occurrence by using high-end sockets that can give better flexibility for warpage (won't monitor the warpage itself, but may minimize the likelihood of occurrence of warpage)—such sockets are very expensive.
2. Monitor the consumed current from the power supply by the BIB—If current level is in desired range, then it is assumed that whole setup is operating correctly and no disconnection occurred. However, monitoring consumed current from the power supply will not identify which pin was disconnected and the resolution of this measurement is low, as one power supply is usually connected to tens of DUTs. Given such a setup, it will not be possible to identify cases where 1 unit was disconnected for short time and reconnected at the same time another unit is disconnected, since the total current will stay the same.

Another possible solution to detecting electrical disconnection due to chip packaging warpage is to provide a monitoring connection for each pin on the chip. However, such a solution is not feasible especially since the number of pins available on a chip for sensing connections and monitoring connections may be limited. Limiting the number of sensing and monitoring pins or other connections on a chip is a very important design consideration, as the number of I/O pins on a chip is limited and such pins are need for chip I/O functions.

Accordingly, there exists a need for improved methods, systems, and computer readable media for detecting electrical disconnection between IC chip electrical connections and corresponding electrical contacts on a printed circuit board during testing of the chip under environmental conditions.

SUMMARY

Methods, systems, and computer readable media for detecting electrical disconnection between an integrated circuit chip electrical connections and corresponding electrical contacts on a printed circuit board or a chip socket during testing of the chip under environmental conditions are disclosed. One method includes providing n monitor connections on a chip from which a voltage or current can be sensed during testing of the chip under environmental conditions, where n is an integer of at least one. The method further includes providing m sensing connections on the chip. The m sensing connections connect to contacts on the printed circuit board or chip socket, and m is an integer greater than n. The method further includes providing an electrical circuit for electrically connecting the n monitor connections with the m sensing connections. The electrical circuit has a characteristic that changes when one or more of the m sensing connections is disconnected from its corresponding contact on the printed circuit board or chip socket. The method further includes testing the chip, monitoring, via the n monitor connections, the electrical circuit during the testing. The method further includes identifying, based on changes in the characteristic, whether one or more of the m sensing connections is disconnected from the printed circuit board or chip socket.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which.

DETAILED DESCRIPTION

Methods, systems, and computer readable media for detecting electrical disconnection between integrated circuit chip electrical connections and corresponding electrical contacts on a printed circuit board or chip socket during testing of the chip under environmental conditions are disclosed. Rather than using expensive sockets that reduce chip warpage, monitoring changes in power supply current, or using a monitor connection for every sensing connection, the subject matter described herein includes using n monitor connections for m sensing connections where m is greater than n. The sensing connections may be pins or electrical contacts that correspond to physical locations on a chip package that are likely to become disconnected from contacts on a printed circuit board or chip socket during thermal or other environmental testing. The monitor connection(s) may be one or more pins or contacts on the chip that are electrically connected to the sensing connections.

Figure 1A:
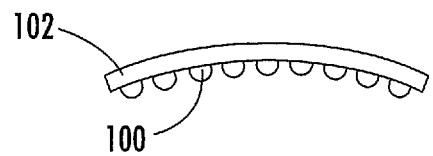
FIG. 1A is a schematic diagram illustrating dome type warpage of chip packaging during environmental testing.
Figure 1B:
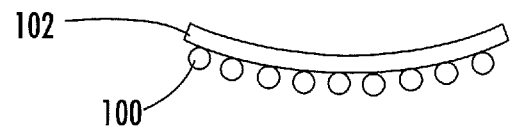
FIG. 1B is a schematic diagram illustrating camber type warpage of chip packaging during environmental testing.
Figure 2:
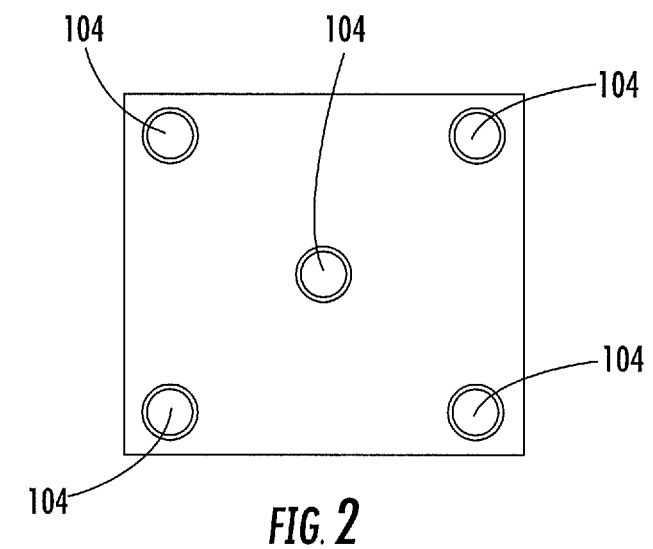
FIG. 2 is a schematic diagram illustrating an exemplary layout of sensing connections on a chip according to an embodiment of the subject matter described herein.

FIG. 2 illustrates an exemplary layout for sensing connections according to an embodiment of the subject matter described herein. Referring to FIG. 2, integrated circuit chip package 102 includes five sensing connections 104. In one embodiment, five sensing connections can be monitored using a single monitor connection. In the illustrated example, the sensing connections are located at the corners of chip package 102 and at the center of chip package 102, which are areas that are more likely to be disconnected due to thermal expansion and contraction of the chip package as illustrated in FIGS. 1A and 1B.

In one embodiment, the exact location of a disconnection can be determined by monitoring a single monitor connection that is electrically connected to plural sensing connections and that includes a characteristic that changes differently depending on which sensing connection becomes disconnected from a printed circuit board during testing. For example, the characteristic may be capacitance, inductance, resistance, impedance, or time constant. Alternatively, the characteristic may be a voltage, a current, a charging state, a discharging state, or other measurable value that indicates disconnections of one or more sensing connections from a connection on the circuit board or socket in which the chip is connected during testing. Each sensing connection can be connected to the monitor connection via a different capacitance, inductance, resistance, impedance, or time constant. Changes in the capacitance, inductance, resistance, or impedance can be monitored during testing by sensing a voltage or current at the monitor connection. The current or voltage will change differently depending on which sensing connection becomes disconnected due to the difference in capacitance, inductance, resistance, or impedance. Specific examples of circuits for connecting monitor connections to sensing connections will be described in detail below.

In one embodiment, a voltage change at a single reference point may be monitored without the need to separately monitor each sampling connection. If an electrical disconnection is detected while a chip is undergoing functional testing and the time of the disconnection corresponds to a failure in the functional testing, the cause of the failure in the functional testing can be correlated with the disconnection, rather than a failure of the underlying functionality of the chip.

Figure 3:
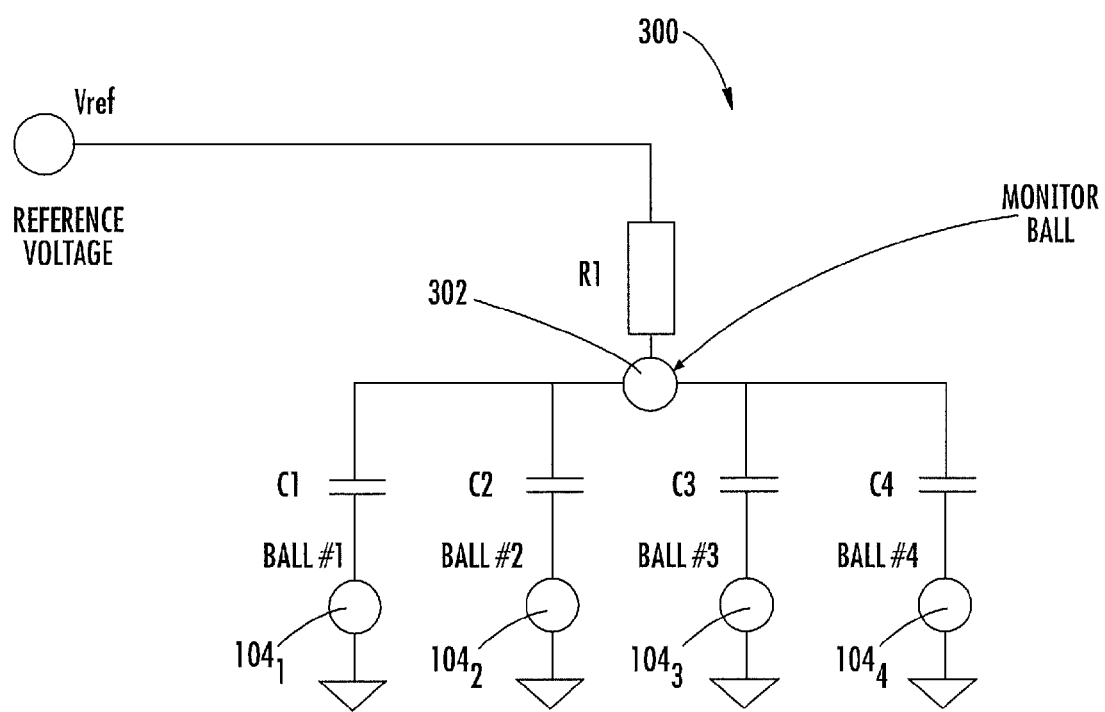
FIG. 3 is a circuit diagram illustrating an exemplary circuit for monitoring m sensing connections with n monitor connections where m is greater than n and both m and n are integers (m=5 (including Vref) and n=1) according to an embodiment of the subject matter described herein.

FIG. 3 is a circuit diagram of an exemplary circuit that can be used to monitor sensing connections from a single monitor connection. In FIG. 3, circuit 300 comprises a resistance-capacitance (RC) circuit. The RC circuit includes capacitors C1-C4 connected to sensing connections $104_1$-$104_4$. In the illustrated example, a single monitor connection 302 may be used to monitor a reference voltage Vref and to sense changes in voltage due to disconnection of any sensing connections $104_1$-$104_4$ from its respective contact on the printed circuit board or socket in which a chip is located during testing. A resistor R1 and the summed capacitances C1-C4 control the time constant of the circuit. The reference voltage Vref is applied to initially charge the capacitors during testing. Thus, in FIG. 3, because a single monitor connection 302 monitors a reference voltage connection and 4 sensing connections $104_1$-$104_4$, it can be said that the circuit in FIG. 4 allows a single monitor point to monitor 5 sensing points.

In the illustrated example, capacitors C1-C4 are connected in parallel so that the total capacitance is C1+C2+C3+C4. In one exemplary test, the reference voltage Vref can be applied to charge the capacitors. Subsequently, Vref may be disconnected. When Vref is disconnected, capacitors C1-C4 will discharge, resulting in a decrease in voltage at monitor connection 302, where the rate of decrease is determined by the time constant R1×(C1+C2+C3+C4). The capacitors C1-C4 can be sized differently so that the change in monitored voltage during discharging can be used to identify which capacitor is disconnected from ground. In one embodiment, the voltage level at monitor connection 302 may be sampled at constant intervals based on the time constant of the circuit, and the value of the sampled voltage at each sampling time may be compared to an expected voltage to determine whether one or more capacitors have been disconnected. If the discharge rate does not reach expected rate, this means that one or more of the capacitors of the RC circuit has been disconnected and the disconnection may be identified and correlated with other test results. For example, if a disconnection occurs at the same time as a failure during a functional test, the failure during the functional test may be correlated with a disconnection.

Figure 4:
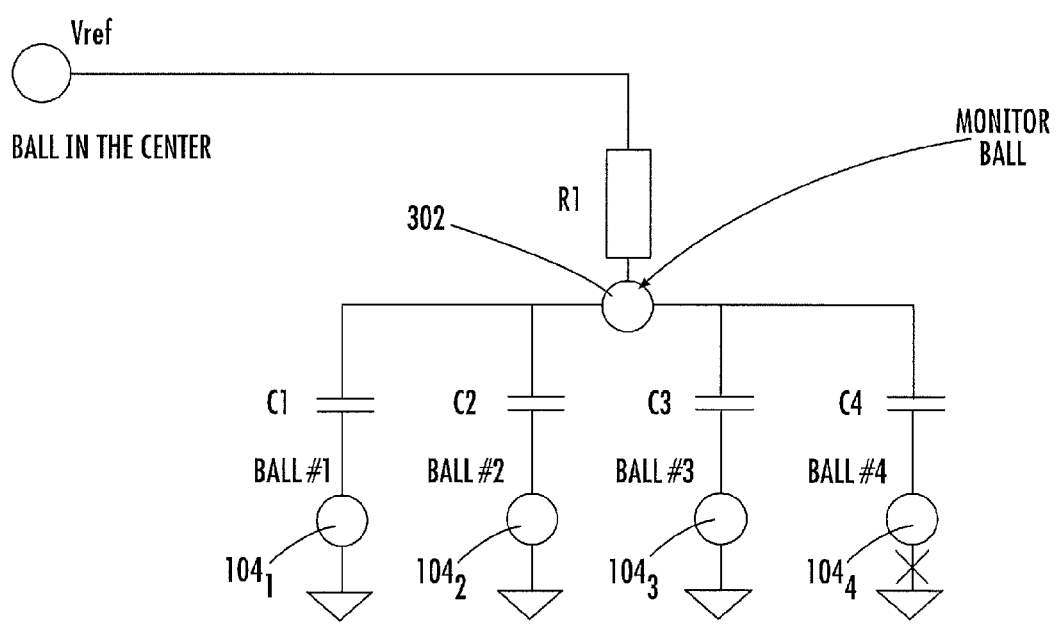
FIG. 4 is a circuit diagram of the circuit illustrated in FIG. 3 when one of the sensing connections has become disconnected from its contact on a printed circuit board.
Figure 5:
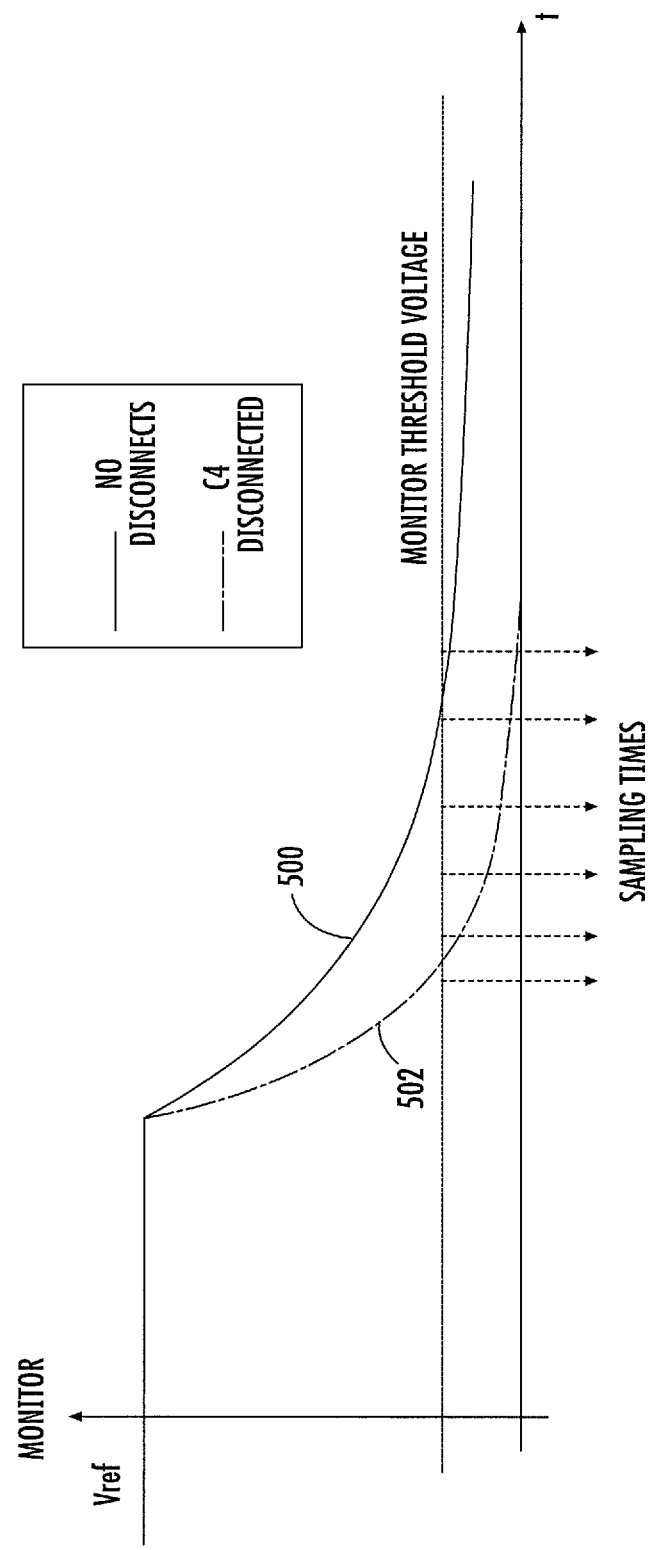
FIG. 5 is a graph illustrating sample times and two discharge curves for the electrical circuit illustrated in FIG. 3.

FIG. 4 is a diagram of the circuit illustrated in FIG. 3 where C4 has become disconnected from ground. FIG. 5 is a graph illustrating a discharge curve for the entire circuit (with all of the capacitors C1-C4 connected), a discharge curve for the circuit with C4 disconnected, and sample times. In FIG. 5, curve 500 represents the discharge curve for the entire circuit assuming that all of the capacitors are connected. Curve 502 represents the discharge curve of the circuit assuming C4 has been disconnected. As can be seen from FIG. 5, when C4 is disconnected, the time consonant of the circuit is reduced and the voltage at monitor connection 302 decreases more rapidly than when all the capacitors are connected. If the capacitors are chosen such that C1<C2<C3<C4 as described above, and the sample times are appropriately chosen, the identification of the capacitor that has actually become disconnected can be determined. For example, if C3 is disconnected during testing, and C4 remains connected, the discharging of the circuit will take more time than curve 500 but less than curve 502.

Figure 6:
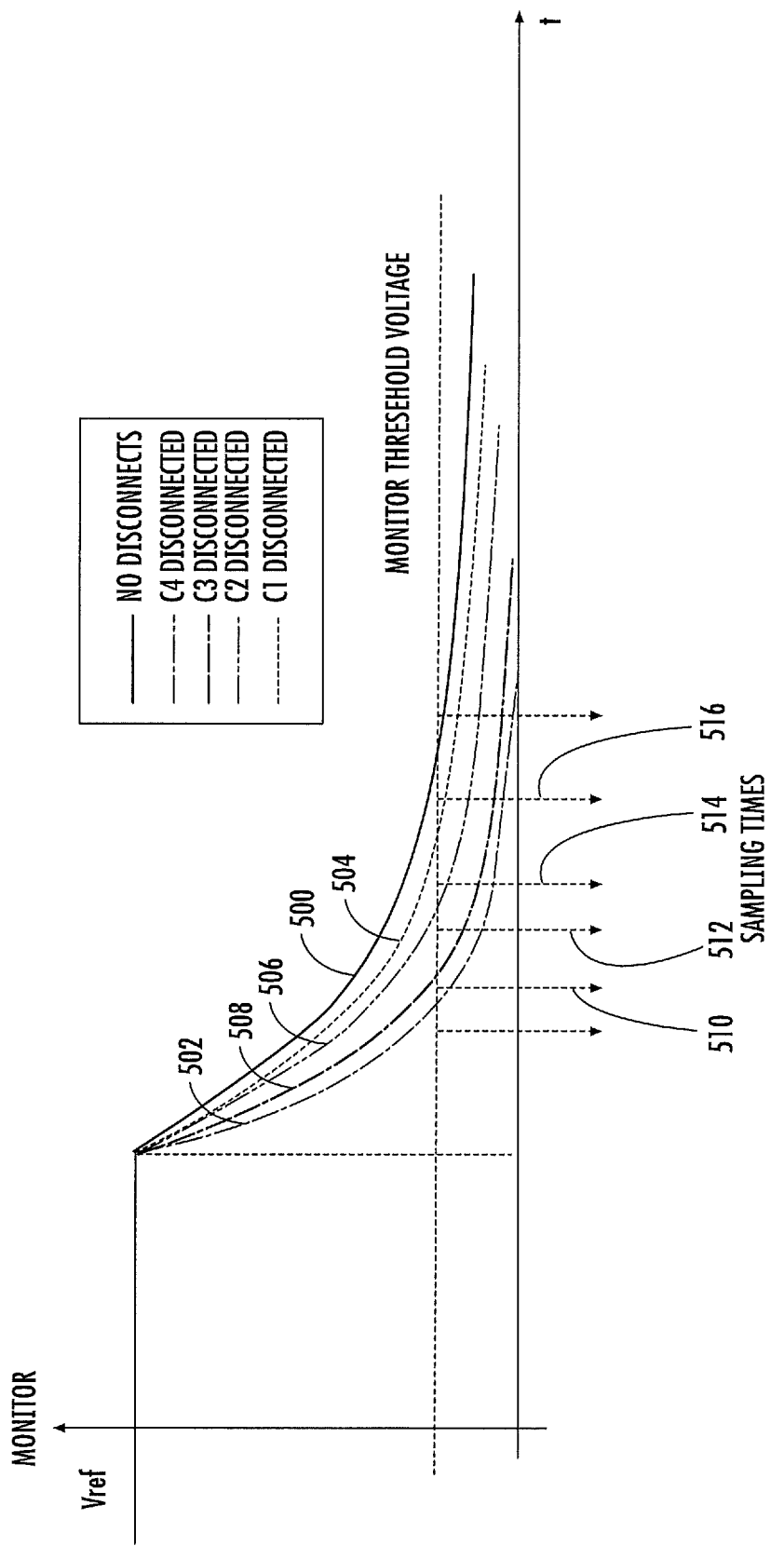
FIG. 6 is a graph illustrating sampling times and a complete set of discharge curves for the electrical circuit illustrated in FIG. 3.

FIG. 6 is a graph illustrating discharge curves for the entire circuit and for disconnection of each individual capacitor. As before, curve 500 represents the discharge curve for the entire circuit assuming no disconnection, and curve 502 represents the discharge curve for the circuit assuming C4 is disconnected. Curve 504 is the discharge curve assuming C1 is disconnected, curve 506 is the discharge curve assuming C2 is disconnected, and curve 508 is the discharge curve assuming C3 is disconnected.

By selecting appropriate sampling times, the identification of the capacitor that is disconnected can be determined. For example, sampling time 510 may correspond to capacitor C4, sampling time 512 may correspond to capacitor C3, sampling time 514 may correspond to capacitor C2, and sampling time 516 may correspond to capacitor C1. As an example, if Vref is sampled at sampling time 510, if the monitored voltage is above the threshold voltage, it can be assumed that C4 remains connected. However, if the monitored voltage is below the threshold voltage, it can be assumed that C4 is disconnected. Similarly, at sampling time 512, if the sampled voltage is above the threshold voltage, it can be assumed that C3 remains connected. If the sampled voltage is below the threshold voltage, it can be assumed that C3 is disconnected. At sampling time 514, if the sampled voltage is above the threshold voltage, it can be assumed that C2 is connected, and if the sampled voltage is below the threshold voltage, it can be assumed that C2 is disconnected. At sampling time 516, if the sampled voltage is above the threshold voltage, it can be assumed that C1 remains connected, and if the sampled voltage is below the threshold voltage it can be assumed that C1 is not connected. Thus, using appropriately sized capacitors and appropriately spaced sampling times. The identification of individual sensing connections that are disconnected can be determined. Such information can be correlated with failures that occur during functional testing to determine the cause of the failures.

Figure 7:
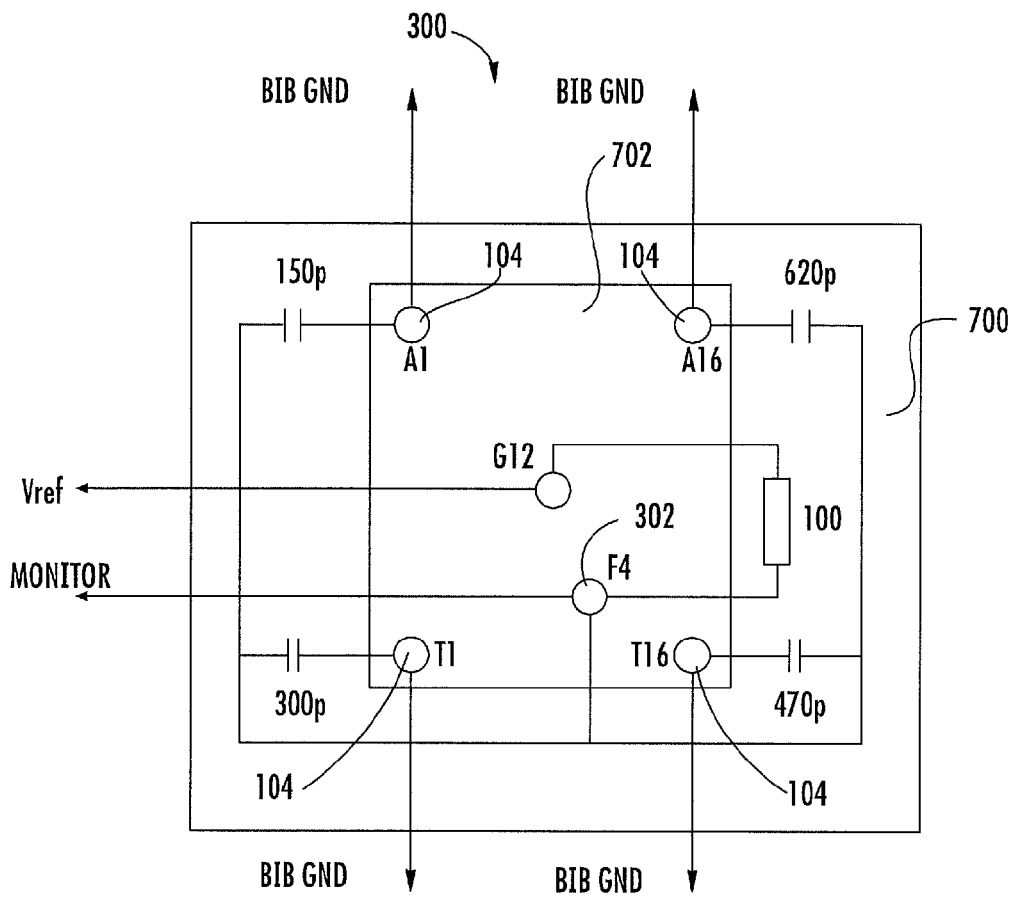
FIG. 7 is a schematic diagram illustrating an exemplary layout of the electrical circuit of FIG. 3 on a chip according to an embodiment of the subject matter described herein.

In one embodiment, circuit 300 illustrated in FIG. 3 can be located at least partially on the silicon of the chip being monitored and partially on the substrate. FIG. 7 illustrates an exemplary layout of circuit 300. In FIG. 7, the capacitors that are used with each sensing connection 104, the sensing connections 104, the Vref connection, and the monitor connection 302 are located on the substrate 700. In FIG. 17, rectangle 702 represents the silicon of the chip. In an alternate embodiment, all of the circuit 300 may be located on the printed circuit board on which the chip is mounted and not on the chip substrate 700.

Figure 8:
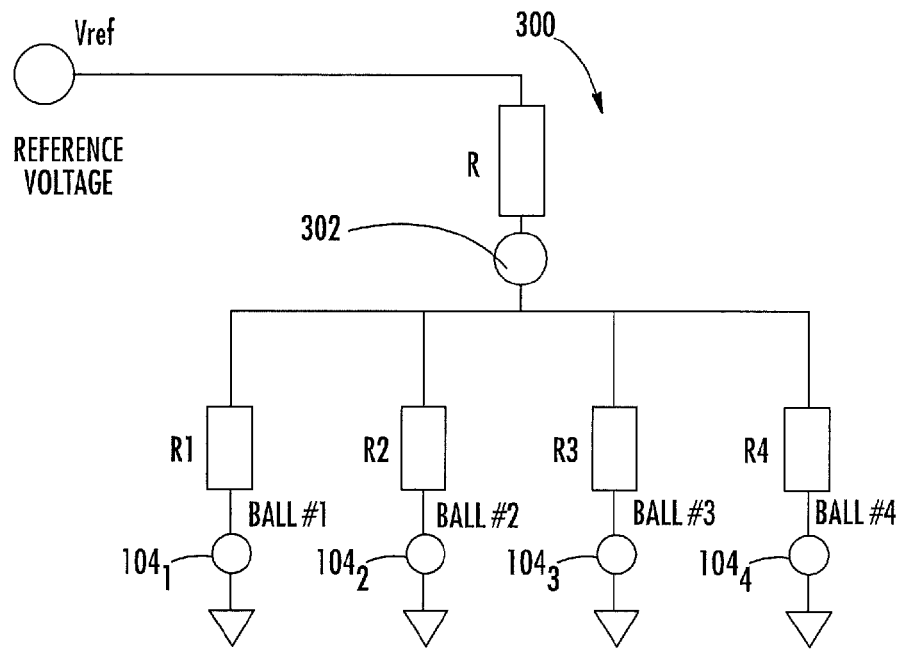
FIG. 8 is a circuit diagram illustrating an alternate embodiment of the electrical circuit illustrated in FIG. 3.

The subject matter described herein is not limited to using an RC circuit to monitor m sensing connections from n monitor connections. In an alternate embodiment, a voltage divider circuit can be utilized. FIG. 8 illustrates an exemplary voltage divider circuit that can be used to monitor m sensing connections from n monitor connections where m is less than n. Referring to FIG. 8, resistors R1-R4 are connected between sensing connections $104_1$-$104_4$ and monitor connection 302. A resistor R is located between monitor connection 302 and the Vref ball. The values of R1-R4 can be chosen such that the identity of individual disconnections can be determined. In one embodiment, different values of each of R1-R4 can be used.

In operation, Vref may be initially applied and the current or voltage can be monitored at monitor connection 302. The voltage may be applied until the current or voltage at monitor connection 302 reaches a steady state. The voltage at monitor ball 302 in this example will be referred to as Vmon. The variable Req in this example refers to the parallel sum of the resistances R1-R4. The voltage Vmon is thus equal to (Req/(Req+R)) times Vref. If any of the sensing connections $104_1$-$104_4$ become disconnected from ground, the corresponding resistor will be removed from the circuit, changing the value of Req, which changes the value of the monitored voltage Vmon. From the amount of change in Vmon, the identity of the sensing connection that has been disconnected can be determined. In a simple example, if Vref=5V, R=1Ω, R1=1Ω R2=2Ω R3=3Ω R4=4Ω, with no sensing connections disconnected, the voltage Vmon is equal to 1.62 V. Table 1 shown below illustrates values for Vmon if each of R1-R4 becomes disconnected.

TABLE 1

| Sample Values for Vmon with R1-R4 Disconnected | | | |
|---|---|---|---|
| R1 Disconnected | R2 Disconnected | R3 Disconnected | R4 Disconnected |
| 2.40 V | 1.93 V | 1.82 V | 1.76 V |

From Table 1, it can be seen that by choosing different values for R1-R4 and sensing Vmon, the identity of the sensing connection that has become disconnected can be readily determined.

The subject matter described herein is not limited to using RC or voltage divider circuits to connect a chip monitor point to sensing points. Any suitable circuit from which the identity of the sensing point that has become disconnected can be determined based on a change in characteristic of the circuit may be utilized without departing from the scope of the subject matter described herein. In an alternate embodiment, an RLC circuit may be used to connect the monitor point to the sensing points.

Figure 9:
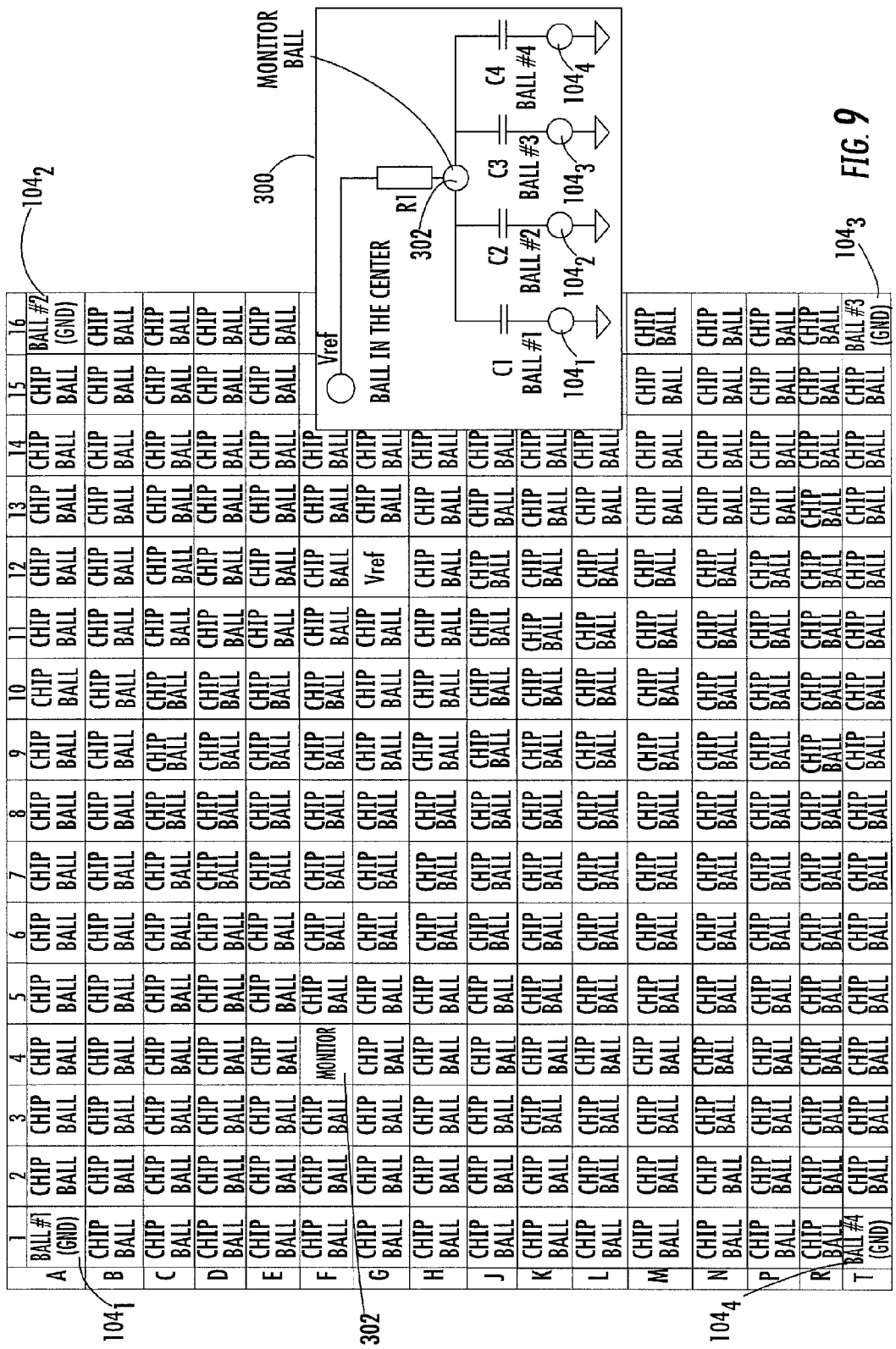
FIG. 9 is a diagram illustrating an exemplary chip ball out including n monitor connections monitoring m sensing connections according to an embodiment of the subject matter described herein.

FIG. 9 is an exemplary chip ball out where the sensing connections, the monitor connection, and a connection for applying the reference voltage, Vref, are located on an exemplary chip. Disconnect sensing circuit 300 is also shown schematically in FIG. 9. In FIG. 9, each cell corresponds to a connection on an integrated circuit chip that will connect to a ball in a ball grid array (BGA) chip package. Balls 1-4 located in the corners of the chip correspond to sensing connections $104_1$-$104_4$. Monitor connection 302 is located near the center of the chip. Another ball, labeled "Vref" is used to apply the referenced voltage. By placing the sensing connections $104_1$-$104_4$ near the corners and by placing the monitor ball near the center, both camber type and dome type warpage can be detected during testing of the chip under environmental conditions.

It should be noted that the IC chip on which the circuit, the sensing connections, and the monitor connections described herein are implemented can have any suitable functions or components. in one embodiment, the circuit may be an ASIC with embedded memory, such as a 2D or 3D NAND flash memory. An exemplary 3D NAND flash memory suitable for use with embodiments of the subject matter described herein is the bit cost scalable (BiCS) 3D NAND flash memory available from SanDisk Corporation.

Figure 10:
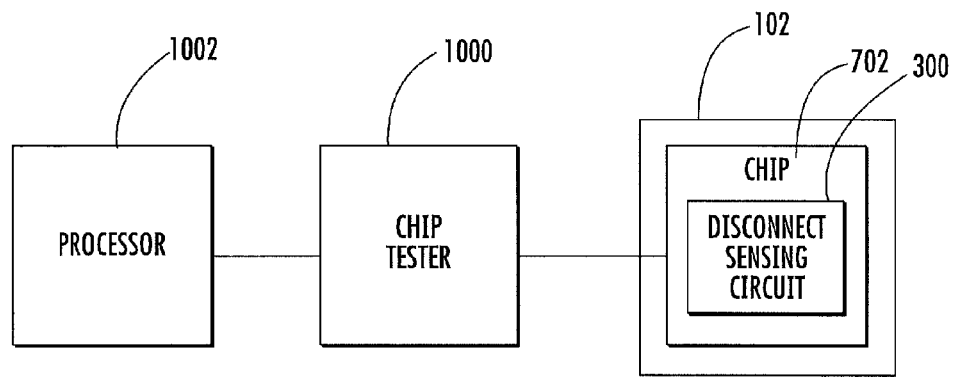
FIG. 10 is a block diagram illustrating an exemplary integrated circuit chip test system according to an embodiment of the subject matter described herein.
Figure 11:
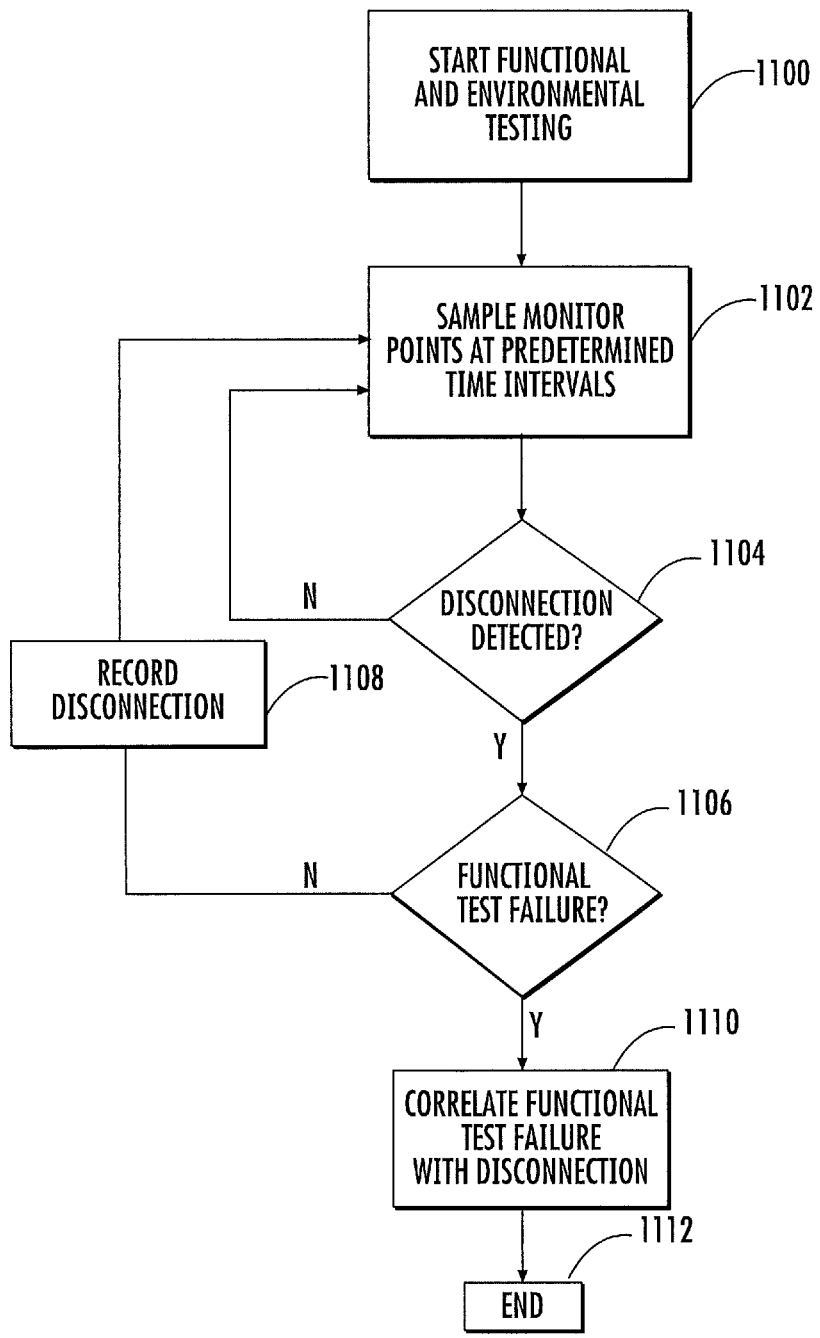
FIG. 11 is a flow chart illustrating an exemplary process for detecting electrical disconnections and testing an integrated circuit chip according to an embodiment of the subject matter described herein.

FIG. 10 is a block diagram and FIG. 11 is a flow chart illustrating an exemplary system and process for testing a chip while detecting electrical disconnection between an integrated circuit chip electrical connections and corresponding electrical contacts on a printed circuit board according to an embodiment of the subject matter described herein. Referring to FIG. 10, a chip tester 1000 may have connections to circuit 300 and to other pins of chip 702 to perform both monitoring of electrical connections and disconnections and functional testing of the chip. Chip tester 1000 may be at least partially executed by a processor 1002. Processor 1002 may include at least some hardware for executing instructions or having logic that implements the corresponding instructions for performing functional testing of chip 702 and electrical disconnection testing of chip package 102 from a printed circuit board or socket. In one exemplary testing environment, chip package 102 may be tested under thermal stresses while chip tester 1000 performs functional testing.

Referring to FIG. 11, in step 1100, functional and environmental testing of a chip is initiated. Functional testing may include transmitting signals to the chip and monitoring the responses. Environmental testing may include heating and cooling of chip package 102 while performing the functional testing. In step 1102, the monitor point or points are sampled at predetermined time intervals. The predetermined time intervals may be those described above. In step 1104, it is determined whether a disconnection has been detected. If a disconnection has not been detected, control returns to step 1102 where the sampling and chip functional testing continues. If a disconnect is detected, control proceeds to step 1104 where it is determined whether a functional test failure has occurred at the same time as the electrical disconnection. If a functional test failure has not occurred, control proceeds to step 1108 where the disconnection is recorded and sampling and functional testing continues.

In step 1106, if a functional test fails at the same time as an electrical disconnection, control proceeds to step 1110 where the functional testing failure is correlated with the disconnection. Because of the failure, in step 1112, the functional test ends.

Different testing scenarios may be performed other than that illustrated in FIG. 11. However, FIG. 11 is merely illustrative to show how specific disconnections can be correlated with functional test failures.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for detecting electrical disconnection between integrated circuit chip electrical connections and corresponding electrical contacts on a printed circuit board or a chip socket during testing of the chip under environmental conditions, the method comprising:
    providing n monitor connections on an integrated circuit (IC) chip from which a voltage or current can be sensed during the testing of the chip under the environmental conditions, n being an integer of at least one;
    providing m sensing connections on the chip, the m sensing connections for connecting to the printed circuit board or chip socket during the testing of the chip under the environmental conditions, m being an integer greater than n;
    providing an electrical circuit for electrically connecting the n monitor connections with the m sensing connections, the electrical circuit having a characteristic that changes when one or more of the m sensing connections is disconnected from its corresponding contact on the printed circuit board or chip socket; and
    testing the chip, monitoring, via the n monitor connections, the circuit during the testing, and identifying, based on changes in the characteristic, whether one or more of the m sensing connections is disconnected from the printed circuit board or chip socket.

2. The method of claim 1 wherein the electrical circuit is structured so that the identity of one of the m sensing connections that is disconnected during the testing can be identified.

3. The method of claim 1 wherein the electrical circuit comprises a resistance-capacitance (RC) circuit including m capacitors connected in parallel with each other and each capacitor being connected to one of the m sensing connections.

4. The method of claim 3 comprising charging the capacitors and wherein monitoring the circuit includes monitoring a voltage level at the n monitor connections as the capacitors discharge to detect a change in time constant of the circuit.

5. The method of claim 4 wherein identifying whether one or more of the m sensing connections is disconnected from the printed circuit board or chip socket includes detecting a voltage level that indicates an decrease in discharge time of the circuit caused by disconnection of one or more of the capacitors from the printed circuit board or chip socket.

6. The method of claim 5 wherein monitoring the circuit includes sampling the voltage at different times during discharging of the capacitors.

7. The method of claim 6 wherein sampling the voltage at different times includes sampling the voltage at one time for each of the capacitors during a discharge interval.

8. The method of claim 1 wherein the circuit comprises a voltage divider circuit and the characteristic comprises a change in a monitored voltage of the circuit.

9. The method of claim 8 wherein identifying whether one or more of the m sensing connections is disconnected from the printed circuit board or chip socket determining the identity of a disconnected sensing connection based on a change in the monitored voltage.

10. The method of claim 1 wherein n=1 and m=5.

11. The method of claim 1 wherein at least some of the m sensing connections are located near corners of the chip.

12. The method of claim 1 wherein the IC chip includes a 3D NAND flash memory.

13. A system for detecting electrical disconnection between integrated circuit chip electrical connections and corresponding electrical contacts on a printed circuit board or chip socket during testing of the chip under environmental conditions, the system comprising:
n monitor connections on an integrated circuit (IC) chip from which a voltage or current can be sensed during the testing of the chip under the environmental conditions, n being an integer of at least one;
m sensing connections on the chip, the m sensing connections for connecting to ground when the chip is connected to the printed circuit board or chip socket during the testing of the chip under the environmental conditions, m being an integer greater than n;
an electrical circuit for electrically connecting the n monitor connections with the m sensing connections, the electrical circuit having a characteristic that changes when one or more of the m sensing connections is disconnected from its corresponding contact on the printed circuit board or chip socket; and
a chip tester for testing the chip, and for monitoring, via the n monitor connections, the circuit during the testing, and identifying, based on changes in the characteristic, whether one or more of the m sensing connections is disconnected from the printed circuit board or chip socket.

14. The system of claim 13 wherein the electrical circuit is structured so that the identity of one of the m sensing connections that is disconnected during the testing can be identified.

15. The system of claim 13 wherein the electrical circuit comprises a resistance-capacitance (RC) circuit including m capacitors connected in parallel with each other and each capacitor being connected to one of the m sensing connections.

16. The system of claim 15 wherein the chip tester is configured to charge the capacitors and to monitor a voltage level at the n monitor connections as the capacitors discharge to detect a change in time constant of the circuit.

17. The system of claim 16 wherein the chip tester is configured to detect a voltage level that indicates an decrease in discharge time of the circuit caused by disconnection of one or more of the capacitors from the printed circuit board or chip socket.

18. The system of claim 17 wherein the chip tester is configured to sample the voltage at different times during discharging of the capacitors.

19. The system of claim 18 wherein the chip tester is configured to sample the voltage at a sample time for each of the capacitors during a discharge interval.

20. The system of claim 13 wherein the circuit comprises a voltage divider circuit and the characteristic comprises a change a monitored voltage of the circuit.

21. The system of claim 20 wherein the chip tester is configured to determine the identity of a disconnected sensing connection based a change in the monitored voltage.

22. The system of claim 13 wherein n=1 and m=5.

23. The system of claim 13 wherein at least some of the m sensing connections are located near a corner of the chip.

24. The system of 13 wherein the IC chip includes a 3D NAND flash memory.

25. A non-transitory computer readable medium having stored thereon executable instructions that when executed by the processor of a computer control the computer to perform steps comprising:
initiating functional testing of an integrated circuit (IC) chip while the IC chip is subjected to varying environmental conditions;
sampling, via n monitor connections, an electrical circuit that connects the n monitor connections m sensing connections, n and m being integers and m being greater than n;
determining, based on the sampling, whether the characteristic has changed; and
in response to determining that the characteristic has changed, indicating a disconnection of one of the n sensing connection from a printed circuit board or socket in which the IC chip is located during the testing.

* * * * *